(12) United States Patent  (10) Patent No.: US 7,680,382 B2
Takagi et al.  (45) Date of Patent: Mar. 16, 2010

(54) METHOD FOR FABRICATING THREE-DIMENSIONAL PHOTONIC CRYSTAL

(75) Inventors: Akinari Takagi, Yokosuka (JP); Hikaru Hoshi, Yokohama (JP); Kiyokatsu Ikemoto, Yokohama (JP); Kazuya Nobayashi, Edogawa-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/330,432

(22) Filed: Dec. 8, 2008

(65) Prior Publication Data

US 2009/0092368 A1  Apr. 9, 2009

Related U.S. Application Data

(63) Continuation of application No. 11/376,985, filed on Mar. 15, 2006, now Pat. No. 7,463,814.

(30) Foreign Application Priority Data

Mar. 25, 2005  (JP) .............................. 2005-089181

(51) Int. Cl.
*G02B 6/10* (2006.01)
(52) U.S. Cl. ........................ 385/129; 385/130; 385/131; 385/147
(58) Field of Classification Search ................ 385/130, 385/131, 129, 147
See application file for complete search history.

(56) References Cited

U.S. PATENT DOCUMENTS

| 5,335,240 | A | 8/1994 | Ho et al. |
| 5,406,573 | A | 4/1995 | Ozbay et al. |
| 5,998,208 | A | 12/1999 | Fraefel et al. |
| 6,392,787 | B1 | 5/2002 | Cirelli et al. |
| 6,396,617 | B1 | 5/2002 | Scalora |
| 6,597,851 | B2 | 7/2003 | Johnson et al. |
| 7,463,814 | B2 * | 12/2008 | Takagi et al. ............... 385/147 |
| 2005/0281524 | A1 | 12/2005 | Mouli |
| 2006/0263025 | A1 * | 11/2006 | Sugita et al. .............. 385/129 |
| 2007/0031108 | A1 * | 2/2007 | Sugita et al. .............. 385/147 |
| 2008/0298419 | A1 * | 12/2008 | Hori et al. ............. 372/50.124 |
| 2009/0008735 | A1 * | 1/2009 | Ogino et al. .............. 257/436 |

OTHER PUBLICATIONS

Eli Yablonovitch, Inhibited Spontaneous Emission in Solid-State Physics and Electronics, Physical Review Letters, vol. 58, 1987, pp. 2059-2062.

* cited by examiner

*Primary Examiner*—Ellen Kim
(74) *Attorney, Agent, or Firm*—Canon U.S.A., Inc. I.P. Division

(57) ABSTRACT

At least one exemplary embodiment is directed to a method for fabricating a three-dimensional photonic crystal. In the method for fabricating the three-dimensional photonic crystal, a plurality of layers can be defined as one unit, and the total thickness of the one unit can be controlled such that an average layer-thickness of the plurality of layers in the one unit is about equal to the ideal layer-thickness so that a photonic band-gap occurs in a desired wavelength region.

7 Claims, 17 Drawing Sheets

DESIGNED VALUE

DESIGNED VALUE

METHOD FOR FABRICATING THREE-DIMENSIONAL PHOTONIC CRYSTAL

CROSS REFERENCE TO RELATED APPLICATIONS

This application is a continuation of U.S. patent application Ser. No. 11/376,985 filed Mar. 15, 2006, which claims the benefit of Japanese Patent Application No. 2005-089181 filed Mar. 25, 2005, each of which is hereby incorporated by reference herein in its entirety.

BACKGROUND OF THE INVENTION

1. Field of the Invention

The present invention relates to methods for readily fabricating three-dimensional photonic crystals.

2. Description of the Related Art

A concept of electromagnetic wave transmission and reflection characteristics being controlled by a structure, which can have a size smaller than the wavelength, has been discussed by Yablonovitch, et al. (Physical Review Letters, 1987, Vol. 58, pp. 2059). According to this document, electromagnetic wave transmission and reflection characteristics can be controlled by periodically arranging structures which can have a size smaller than the wavelength. Light transmission and reflection characteristics can be controlled by decreasing the wavelength of the electromagnetic wave to an order of the light wavelength. Photonic crystals are known for having such a structure, and it is suggested that a reflective mirror, which can have a reflectivity of 100% in a certain wavelength band, i.e., no loss in the light, can be achieved. The concept of no light loss, i.e., achievement of a reflectivity of 100% in a certain wavelength band is called a photonic band-gap, in comparison with an energy gap in a conventional semiconductor. A photonic band-gap for incident light from all the directions can be achieved by structuring a three-dimensional fine periodic structure. Hereinafter, this is referred to as a "complete photonic band-gap". By the realization of the complete photonic band-gap, various applications, for example, suppression of spontaneous emission in a light-emitting device, are possible and a novel functional device can be realized. However, a functional device, which can have a structure able to realize a complete photonic band-gap in a broader wavelength region, can be useful.

Some structures exhibiting such photonic band-gaps have been discussed before (U.S. Pat. Nos. 6,392,787, 6,597,851, and 5335240).

However, a three-dimensional periodic structure exhibiting a photonic band-gap is generally difficult to produce because of its fine structure. Therefore, the three-dimensional periodic structures which can perform in the light wavelength region (the wavelength lower than several μm in vacuum) are rarely produced.

A layer-by-layer structure (LBL structure) that can be produced by stacking layers, which can have a two-dimensional structure, was actually produced and evaluated to experimentally observe a photonic band-gap. For example, a structure discussed in U.S. Pat. No. 6,597,851 and a woodpile structure (FIG. 11) discussed in U.S. Pat. No. 5,335,240 are typical LBL structures.

FIG. 11 is an explanatory diagram of a woodpile structure. The woodpile structure 1000 has a first layer 1001 which is formed by a plurality of rectangular rods which can have a width W and a height H. The rectangular rods of the first layer 1001 extend in the Y-axis direction and are arrayed at a pitch P. The woodpile structure has a second layer 1002 which is formed by a plurality of rectangular rods 1100 which can have the same shape as that of the rectangular rods of the first layer 1001. The rectangular rods of the second layer 1002 extend in the X-axis direction and are arrayed at a pitch P. The woodpile structure has a third layer 1003 which is formed by a plurality of rectangular rods 1100 which can have the same shape as that of the rectangular rods of the first layer 1001. The rectangular rods of the third layer 1003 extend in the Y-axis direction and are arrayed at a pitch P so as to be shifted from the positions of the rectangular rods of the first layer 1001 by a distance of P/2 in the X-axis direction. The woodpile structure has a fourth layer 1004 which is formed by a plurality of rectangular rods 1100 which can have the same shape as that of the rectangular rods of the first layer 1001. The rectangular rods of the fourth layer 1004 extend in the X-axis direction and are arrayed at a pitch P so as to be shifted from the positions of the rectangular rods of the second layer 1002 by a distance of P/2 in the Y-axis direction. The four layers of the first layer 1001 to fourth layer 1004 are stacked in the Z-axis direction to constitute a fundamental period. The woodpile structure 1000 is formed by stacking a plurality of the fundamental periods. FIG. 11 shows a case of that two periods of the fundamental period (1001 to 1004) are stacked. In this structure, all the rectangular rods 1100 are made of a first medium. The portions other than the rectangular rods 1100 are made of a second medium which can have a refractive index different from that of the first medium. The pitch P, width W, and height H of the rectangular rods 1100, the refractive index of the first medium, and the refractive index of the second medium are determined so that the photonic crystal exhibits a photonic band-gap in a desired wavelength region. For example, when the first medium has a refractive index of 3.309, the second medium has a refractive index of 1, and the rectangular rods 1100 have a width W of 0.30×P and a height H of 0.30×P, a complete photonic band-gap is formed in the normalized frequency (angular frequency normalized with a period p) range of 0.362 to 0.432. The photonic band structure is analyzed by a plane-wave expansion method. Therefore, when the rectangular rods 1100 are arrayed at a pitch P of 600 nm, a complete photonic band-gap is formed in the wavelength range of 1389 to 1657 nm.

A variety of methods for fabricating the woodpile structure have been discussed before (U.S. Pat. Nos. 5,406,573 and 5,998,208).

In U.S. Pat. No. 5,406,573, the woodpile structure is fabricated by wafer fusion. In U.S. Pat. No. 5,998,208, the woodpile structure is fabricated by repeating forming of a two-dimensional periodic structure, deposition, and polishing.

The method for fabricating the woodpile which is discussed in U.S. Pat. No. 5,406,573 will be described with reference to FIGS. 12A to 12C. As shown in FIG. 12A, a two-dimensional periodic pattern is formed in a substrate 1201 by etching, and a transfer substrate 1205 comprising a substrate 1204, an etching-stopping layer 1203, and a transfer layer 1202 is fused on the substrate 1201. As shown in FIG. 12B, after the removing of the substrate 1204 and the etching-stopping layer 1203 by etching, a two-dimensional pattern is formed in the remaining transfer layer 1202 by etching. By repeating the fusion, substrate removal, and pattern formation, a laminated structure, which can have a plurality of layers shown in FIG. 12C, is formed.

The method discussed in U.S. Pat. No. 5,998,208 will now be described with reference to FIGS. 13A to 13E. A thin-film layer 1302a made of a first medium is formed on a substrate 1301 by vapor deposition (FIG. 13A), and a two-dimensional periodic pattern is formed in the thin-film layer 1302b by etching (FIG. 13B). Then, the interstices of the two-dimensional periodic pattern formed by the first medium are filled with a second medium 1303a by deposition (FIG. 13C), and the surface is polished (FIG. 13D), resulting in a polished second medium 1303b. A structure shown in FIG. 13E is formed by repeating the thin-film layer formation, two-dimensional periodic pattern formation, deposition, and polishing.

The photonic band-gap is caused by a periodicity of a photonic crystal structure (dielectric constant). In order to produce a photonic crystal structure exhibiting a photonic band-gap in a desired wavelength region, it can be necessary in some circumstances to control a period in the three-dimensional direction (Z-axis direction in FIG. 11). In a fabrication method by stacking layers which have a two-dimensional periodic structure, it can be necessary in some circumstances to control the period of the two-dimensional periodic structure, the dimensional error in each element forming the periodic structure, and the thickness of the layer which can have the two-dimensional periodic structure. In particular, the error in the thickness of the layer, which can have the two-dimensional periodic structure, affects the photonic-band-gap wavelength region more significantly than the error in the dimension of the two-dimensional periodic structure does.

In the woodpile structure shown in FIG. 11, if the actual width W of the rectangular rods 1100 in all the layers is 200 nm when a designed value is 180 nm, the wavelength band of the photonic band-gap shifts by about 60 nm from the designed value. If the actual height (layer thickness) H of the rectangular rods 1100 in all the layers is 200 nm when a designed value is 180 nm, the wavelength band of the photonic band-gap shifts by about 160 nm from the designed value. Thus, the effect of the height error is larger than that of the width error.

In conventional fabrication methods, the error in a fabricated structure is the total of errors during the formation of each layer. Therefore, it can be necessary in some circumstances to control the thickness error of each layer to within 2.5 nm in order to control the shift of the photonic band-gap wavelength from the designed value within 20 nm.

Thus, an acceptable thickness error of each layer can be limited in some cases to a very small range for reducing the shift from a designed value. Therefore, it can be difficult to fabricate three-dimensional photonic crystals that perform in a desired wavelength region.

In the method shown in FIGS. 12A to 12C, errors that occur during the formation of the transfer layer 1202 of the transfer substrate 1205 and errors that occur during the etching for removing the substrate 1204 and the etching-stopping layer 1203 must be controlled within acceptable ranges. In the method shown in FIGS. 13A to 13E, errors that occur during the formation of the thin-film layer 1302a and errors that occur during the polishing must be controlled within acceptable ranges, and also unevenness in the substrate thickness must be controlled within an acceptable range. Thus, the fabrication has been very difficult.

SUMMARY OF THE INVENTION

At least one exemplary embodiment is directed to a method for readily fabricating three-dimensional photonic crystals having a photonic band-gap wavelength with a high accuracy.

In the method for fabricating a three-dimensional photonic crystal according to at least one exemplary embodiment, the three-dimensional photonic crystal is fabricated by stacking a plurality of layers which can have a refractive index periodic structure. The method includes the step of controlling the total thickness of one unit, where the one unit includes a plurality of layers; and the average layer-thickness of the plurality of layers in the one unit is equal to the ideal layer-thickness such that a photonic band-gap occurs in a desired wavelength region.

Further features of the present invention will become apparent from the following description of exemplary embodiments with reference to the attached drawings.

DESCRIPTION OF THE EMBODIMENTS

Figure 1:
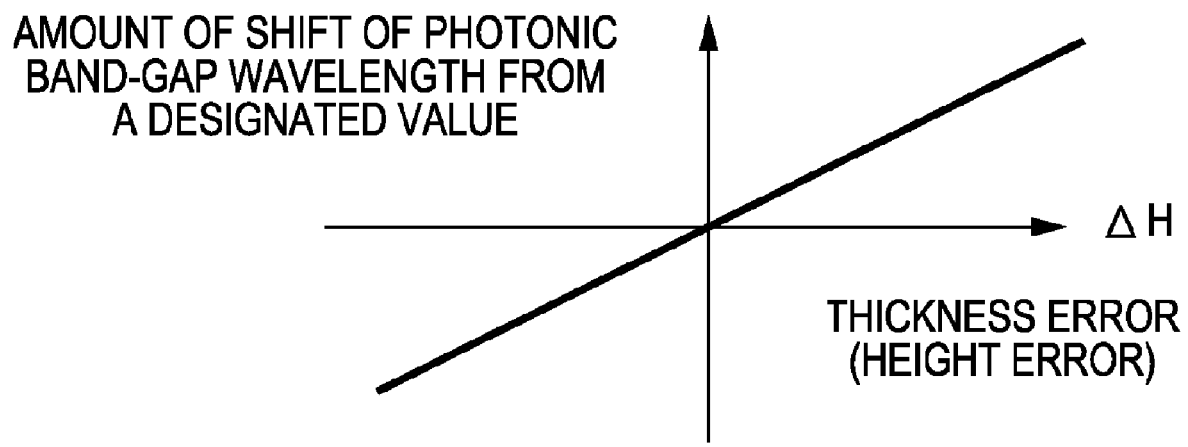
FIG. 1 is an explanatory graph showing a relationship between thickness errors in a two-dimensional periodic structure and photonic band-gap wavelengths.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example particular etching materials and techniques may not be discussed in detail.

Notice that similar reference numerals and letters refer to similar items in the following figures, and thus once an item is defined in one figure, it may not be discussed for following figures.

FIG. 1 illustrates that the amount of change in the photonic band-gap wavelength (the amount of shift from the designed value) is approximately proportional to the thickness error $\Delta H$ of a layer which can have a two-dimensional periodic structure. Additionally, the proportionality constant is approximately constant regardless of the incident light direction. Thus, it has been found that the acceptable range of a thickness error of each layer could be largely increased, while the optical characteristics as a whole three-dimensional photonic crystal could be retained, by controlling the total layer-thickness of a plurality of layers. In the following exemplary embodiments, a predetermined photonic band-gap wavelength is prepared by defining a plurality of layers forming a photonic crystal, which can have a LBL structure as one unit, and controlling the average layer-thickness of the plurality of layers in the one unit so as to be equal to a designed value.

In addition to the plurality of layers, the one unit can be a fundamental period (four layers in FIG. 11) formed by periodically stacking a plurality of layers or integral multiples of the fundamental period.

EMBODIMENTS

Exemplary Embodiment 1

In exemplary embodiment 1, a woodpile structure was fabricated by a method according to at least one exemplary embodiment. In exemplary embodiment 1, four layers 1001 to 1004 are defined as a fundamental period (one period), and a woodpile structure in exemplary embodiment 1 includes six periods in total. The refractive index of rectangular rods (a first region) 1100 forming each layer was adjusted to 3.309 and the refractive index of portions (a second region) other than the rectangular rods was adjusted to 1. The width W and the height H of the rectangular rods 1100 were each 63 nm, and the rectangular rods 1100 were arrayed at a pitch P of 210 nm.

Figure 2A:
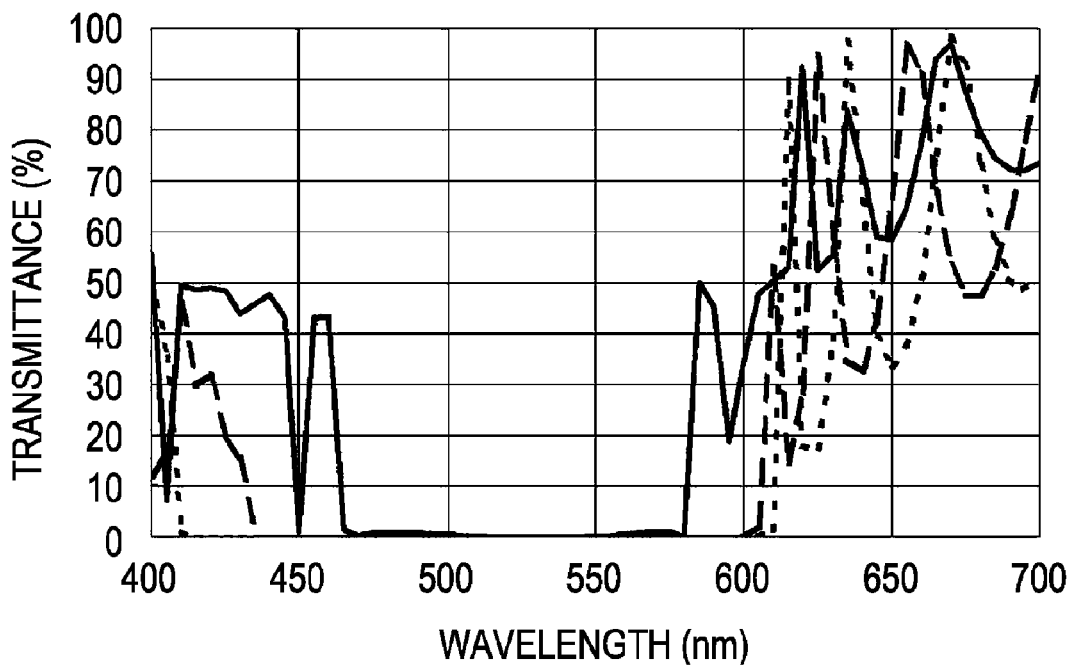
FIG. 2A is an explanatory graph showing a relationship between a fabrication error in a photonic crystal and a photonic band.

FIG. 2A shows transmission spectra calculated (e.g., by using rigorous coupled-wave analysis (RCWA)). The dotted line shows a transmission spectrum when light entered from the direction (direction A in FIG. 11) parallel to the stacking direction (Z-direction). The solid line shows a transmission spectrum when light entered from the direction (direction B in FIG. 11) parallel to the layer. The broken line shows a transmission spectrum when light entered from an oblique direction (direction C in FIG. 11) between the two directions. In the designed values in this exemplary embodiment, a complete photonic band occurs in the wavelength range of 465 to 580 nm.

Figure 2B:
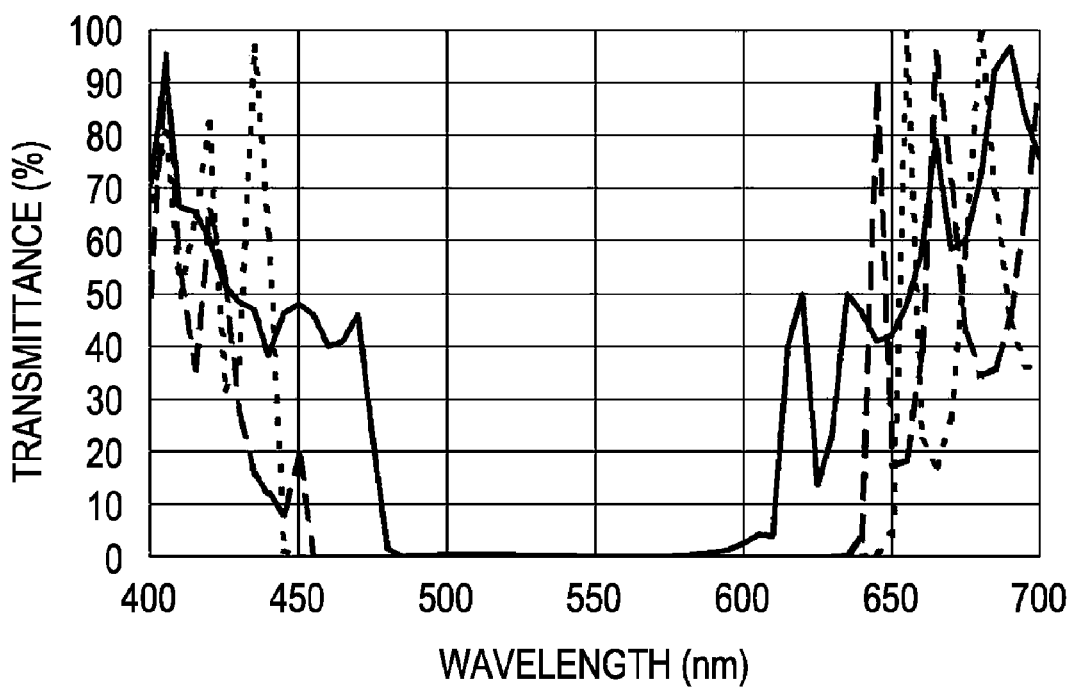
FIG. 2B is an explanatory graph showing a relationship between a fabrication error in a photonic crystal and a photonic band.

FIG. 2B shows transmission spectra when all the rectangular rods had a height H which was 6.3 nm higher than a designed value due to fabrication errors. The complete photonic band-gap wavelength region shifted to a wavelength range of 485 to 610 nm. The photonic band-gap wavelength (central wavelength) shifted about 25 nm toward the longer wavelength side when the rectangular rods had a height which was 10% higher than a designed value. The amount of the shift was approximately constant regardless of the incident direction. Additionally, when the photonic band-gap wavelength region has a range of $\lambda a$ to $\lambda b$, the photonic band-gap wavelength (central wavelength) $\lambda o$ can be defined as follows:

$$\lambda o = (\lambda a + \lambda b)/2. \quad (1)$$

Figure 2C:
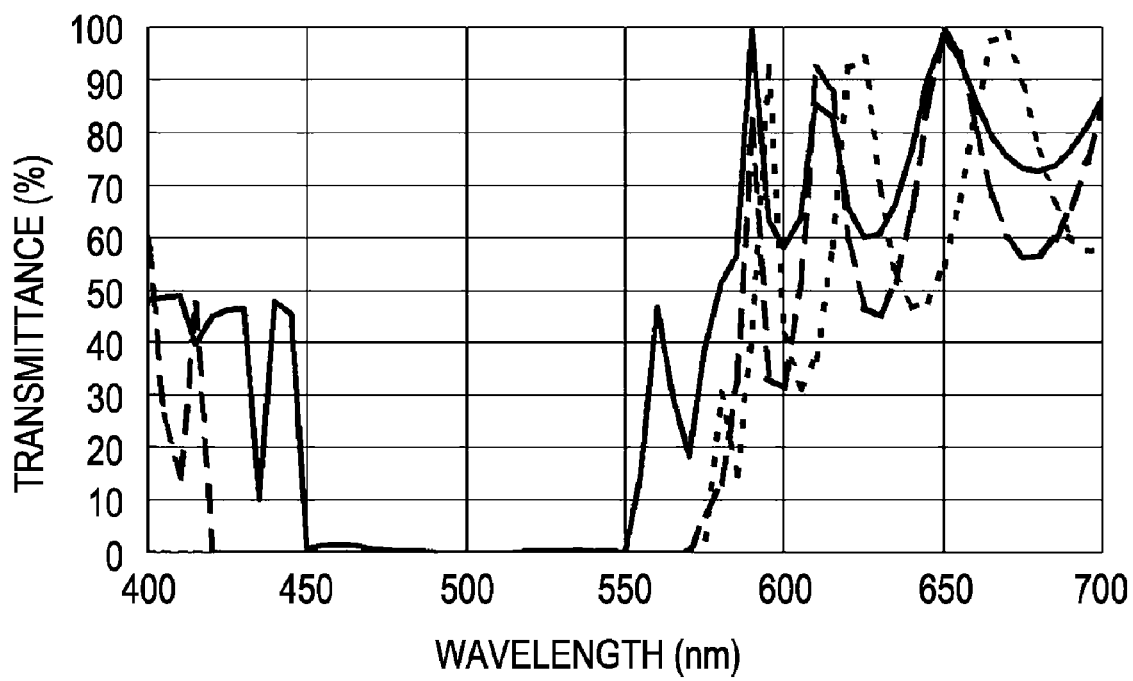
FIG. 2C is an explanatory graph showing a relationship between a fabrication error in a photonic crystal and a photonic band.

On the other hand, FIG. 2C shows transmission spectra when all the rectangular rods had a height H which was 6.3 nm lower than a designed value due to fabrication errors. The complete photonic band-gap wavelength region shifted to a wavelength range of 450 to 550 nm. The photonic band-gap wavelength (central wavelength) shifted about 23 nm toward the shorter wavelength side when the rectangular rods had a height which was 10% lower than a designed value. The amount of the shift was approximately constant regardless of the incident direction.

Thus, the photonic band-gap wavelength region largely shifts from a designed value when the photonic crystal is fabricated by simply stacking layers. In order to control the amount of the shift of the photonic band-gap wavelength within 5 nm, the acceptable error in the height H of the rectangular rods is about 2% (absolute value: 1.2 nm), which can add difficulty to the fabrication.

Figure 2D:
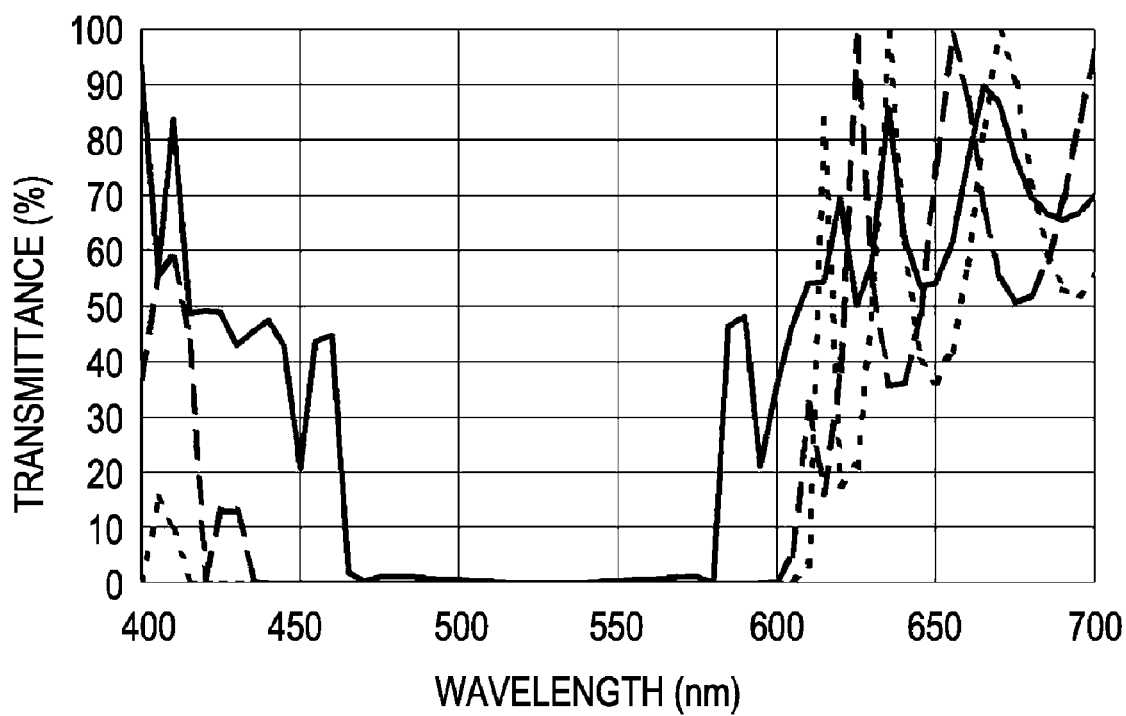
FIG. 2D is an explanatory graph showing a relationship between a fabrication error in a photonic crystal and a photonic band.

In the fabrication method according to at least one exemplary embodiment, a plurality of layers or one or more fundamental periods are defined as one unit, and the average layer-thickness of the plurality of layers in each unit is controlled to be equal to a designed value. The total layer-thickness of one fundamental period comprising four layers was designed to be 252 nm. FIG. 2D shows transmission spectra when the rectangular rods in the four layers had a height H of 66 nm (3 nm higher than the designed value: +3 nm), 57 nm (−6 nm), 60 nm (−3 nm), and 69 nm (+6 nm), respectively. The results show that a complete photonic band occurs in the wavelength range of 465 to 580 nm which is equal to the designed value. Spectrum of incident light from each direction was approximately the same as the designed value.

Figure 2E:
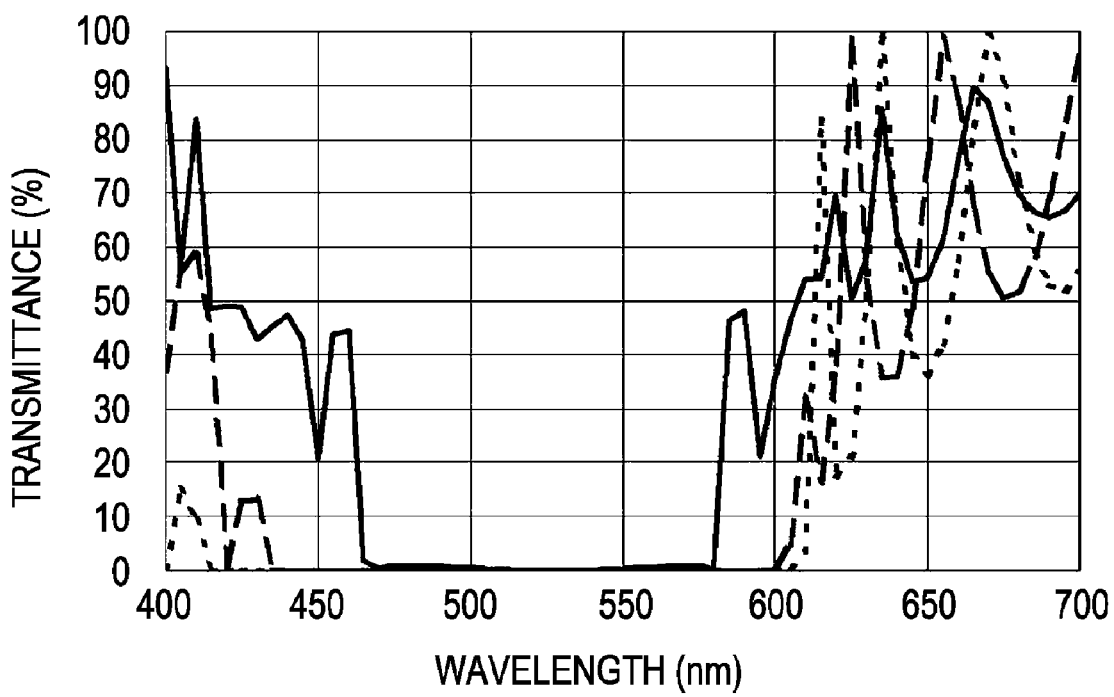
FIG. 2E is an explanatory graph showing a relationship between a fabrication error in a photonic crystal and a photonic band.
Figure 2F:
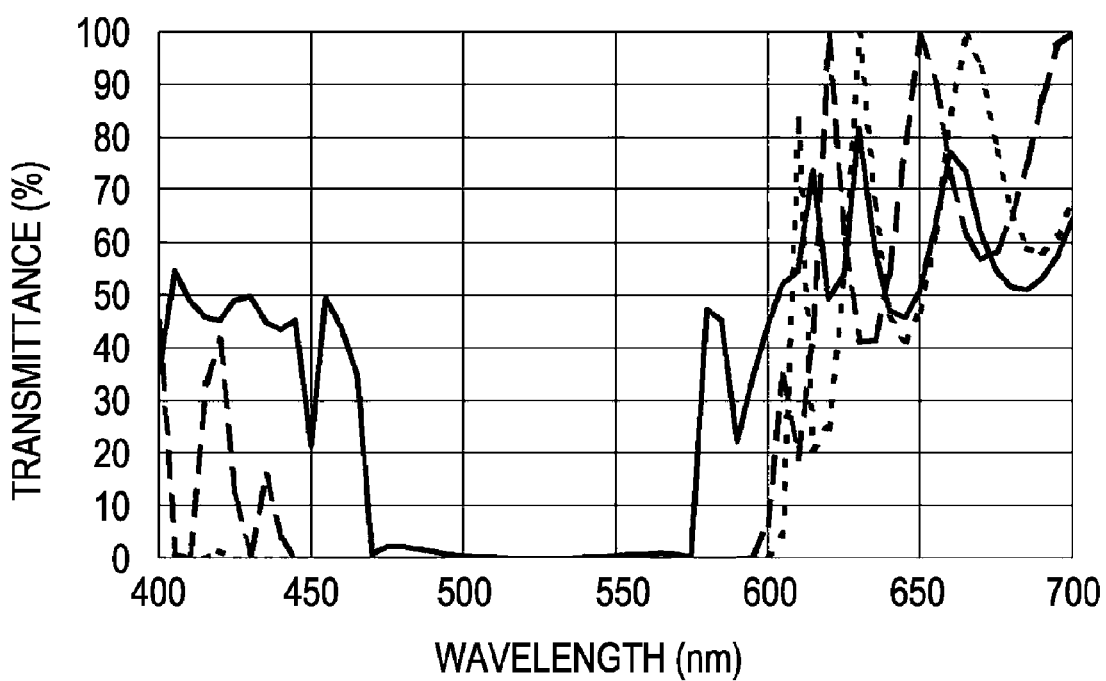
FIG. 2F is an explanatory graph showing a relationship between a fabrication error in a photonic crystal and a photonic band.
Figure 2G:
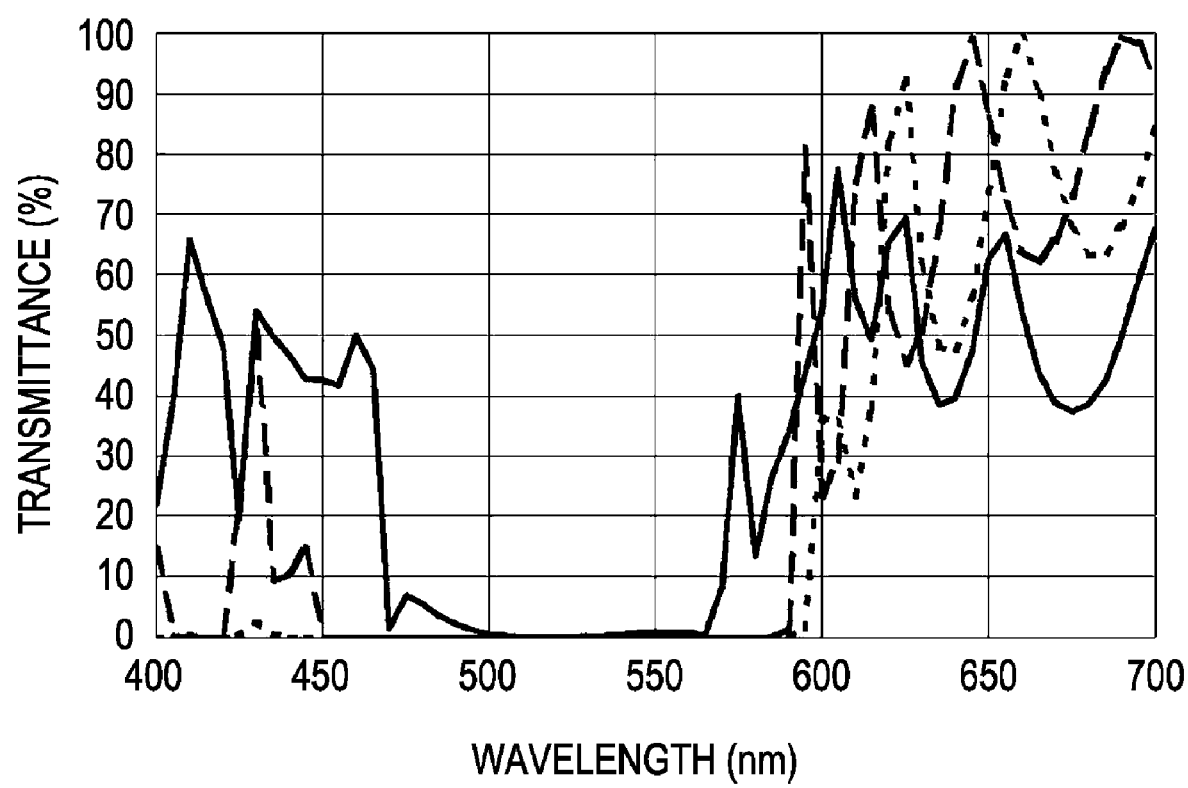
FIG. 2G is an explanatory graph showing a relationship between a fabrication error in a photonic crystal and a photonic band.

Then, FIGS. 2E, 2F, and 2G show transmission spectra when the height error $\Delta H$ of the rectangular rods in each layer was different from that of each other. FIG. 2E shows transmission spectra when the rectangular rods in the four layers had a height H of 66 nm (+3 nm), 66 nm (+3 nm), 66 nm (+3 nm), and 54 nm (−9 nm), respectively. FIG. 2F shows transmission spectra when the rectangular rods in the four layers had a height H of 75 nm (+12 nm), 51 nm (−12 nm), 51 nm (−12 nm), and 75 nm (+12 nm), respectively. FIG. 2G shows transmission spectra when the rectangular rods in the four layers had a height H of 82 nm (+19 nm), 44 nm (−19 nm), 44 nm (−19 nm), and 82 nm (+19 nm), respectively. In all cases, a complete photonic band occurred in the wavelength region which was approximately the same as the designed value.

Thus, even if the height error ΔH of the rectangular rods was about 15 times as large as that of a conventional one, optical characteristics that are approximately equivalent to designed characteristics can be obtained by fabricating the photonic crystal in such a manner that a plurality of layers defined as one unit has an average layer-thickness equal to the designed value in each unit. The definition that the average layer-thickness is about equal to the designed value does not always mean a complete equality. Preferably, an acceptable error in an average layer-thickness is ±5% of a designed value.

In this exemplary embodiment, four layers (fundamental period) can be defined as one unit, but the number of the layers is not limited to this. For example, one unit can consist of two layers or eight layers. However, in at least one exemplary embodiment, directional symmetry or polarization symmetry in the optical characteristics can be improved by using a fundamental period which can have structural symmetry as one unit.

Exemplary Embodiment 2

Exemplary embodiment 2 shows a case that a medium (a first region) comprising the photonic crystal has a refractive index different from that of the medium in exemplary embodiment 1.

The woodpile structure in exemplary embodiment 2 had a fundamental period (one period) comprising four layers 1001 to 1004 and was constituted by six periods in total. The refractive index of rectangular rods (the first region) 1100 comprising each layer was adjusted to 2.33 and the refractive index of portions (a second region) other than the rectangular rods was adjusted to 1. The width W and the height H of the rectangular rods 1100 were each 84 nm, and the rectangular rods 1100 were arrayed at a pitch P of 240 nm.

Figure 3A:
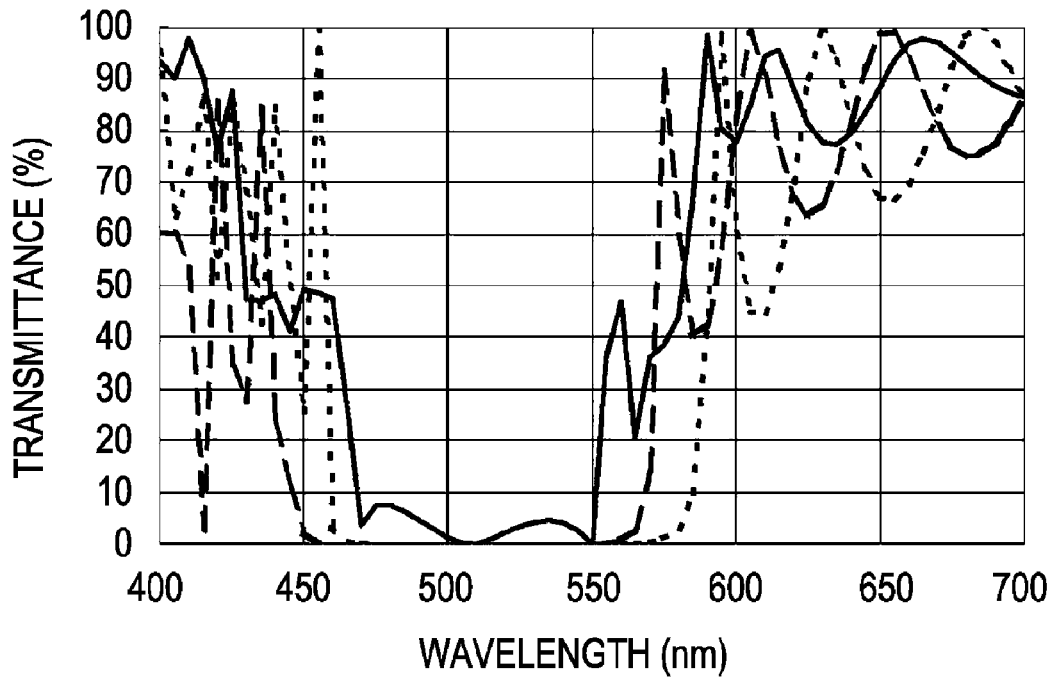
FIG. 3A is an explanatory graph showing a relationship between a fabrication error in a photonic crystal and a photonic band.

FIG. 3A shows transmission spectra calculated by RCWA. The dotted line, solid line, and broken line show transmission spectra of incident light from the respective directions as in FIG. 2A. In the designed values in this exemplary embodiment, a complete photonic band occurs in the wavelength range of 470 to 550 nm.

Figure 3B:
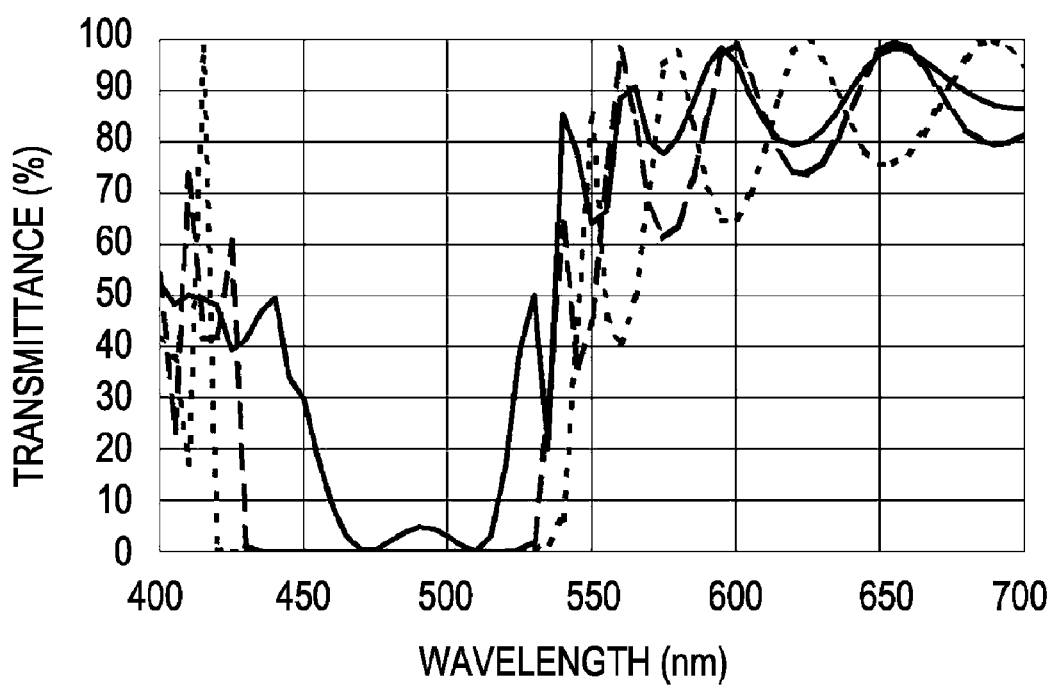
FIG. 3B is an explanatory graph showing a relationship between a fabrication error in a photonic crystal and a photonic band.

FIG. 3B shows transmission spectra when all the rectangular rods 1100 were fabricated to have a height H which was 8.4 nm lower than a designed value due to fabrication errors. The complete photonic band-gap had a wavelength range of 465 to 515 nm. Thus, the photonic band-gap wavelength (central wavelength) shifted about 20 nm toward the shorter wavelength side when the rectangular rods had a height which was 10% lower than a designed value. The amount of the shift was approximately constant regardless of the incident direction.

Figure 3C:
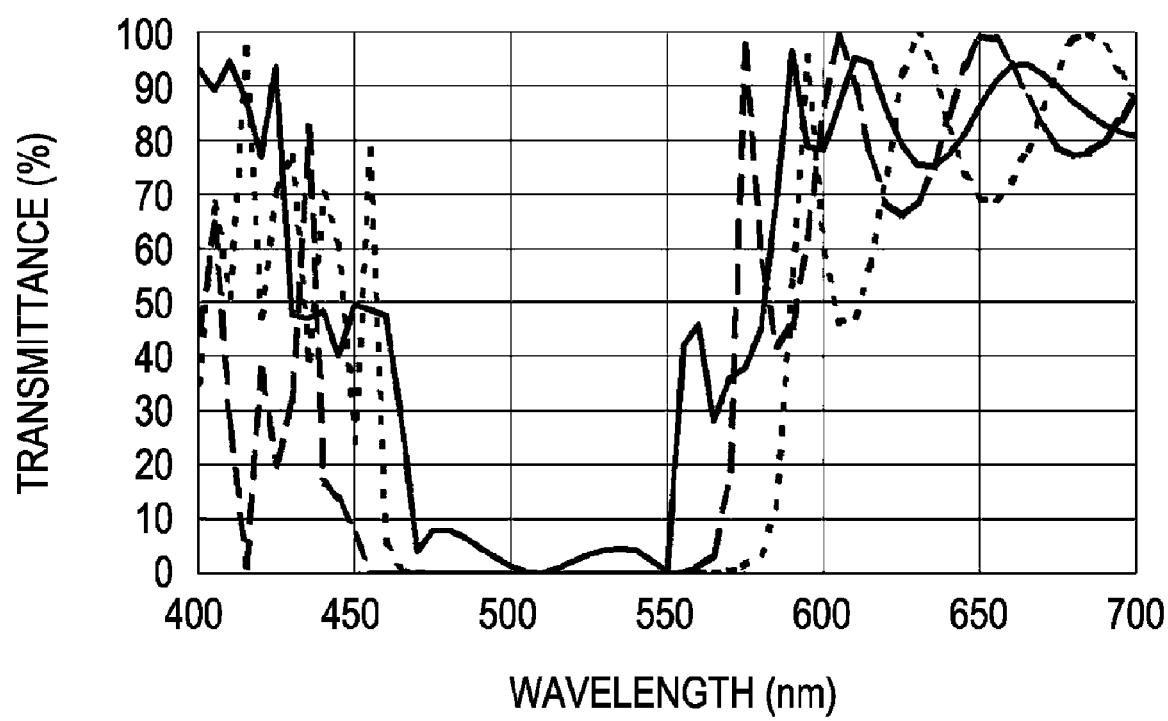
FIG. 3C is an explanatory graph showing a relationship between a fabrication error in a photonic crystal and a photonic band.

In this exemplary embodiment, one unit (fundamental period) includes four layers and the total thickness of the four layers was adjusted to 336 nm which was the same as the designed value. FIG. 3C shows transmission spectra when the rectangular rods 1100 in the four layers had a height H of 88 nm (4 nm higher than the designed value: +4 nm), 76 nm (−8 nm), 80 nm (−4 nm), and 92 nm (+8 nm), respectively. A complete photonic band occurred in the wavelength region of 470 to 550 nm which was the same as the designed value. The spectrum in each incident direction was approximately the same as the designed value.

With the results in Embodiments 1 and 2, it is confirmed that the effects of the present invention are not influenced by the refractive index of the medium forming the photonic crystal.

Exemplary Embodiment 3

An implementation at least one exemplary embodiment in specific processes for fabricating a photonic crystal will be described.

Figure 4A:
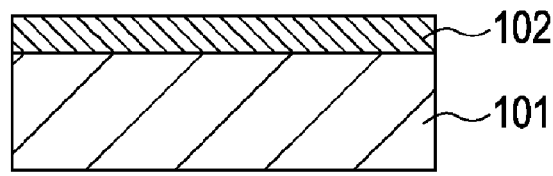
FIGS. 4A to 4I are explanatory diagrams showing fabricating processes of a photonic crystal.
Figure 4B:
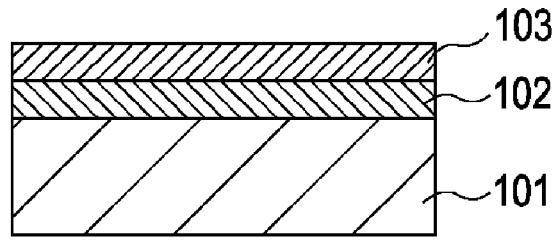
Figure 4C:
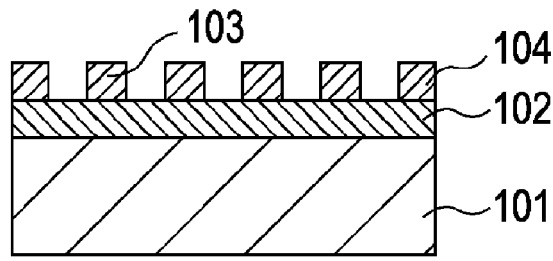
Figure 4D:
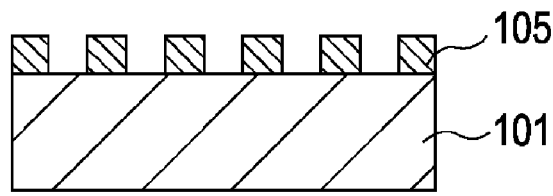

As illustrated in FIG. 4A, a thin film 102 of a first medium is formed on a substrate 101 (e.g., by crystal growth or vapor deposition). Then, a resist 103 is applied on the thin film 102 (FIG. 4B). A desired two-dimensional periodic resist pattern 104 is formed (e.g., by electronic beam lithography) (FIG. 4C). The thin film 102 is etched by using the resist pattern 104 as a mask, and then the remaining resist 104 is removed to form a two-dimensional periodic pattern 105 of the first medium (FIG. 4D).

Figure 4E:
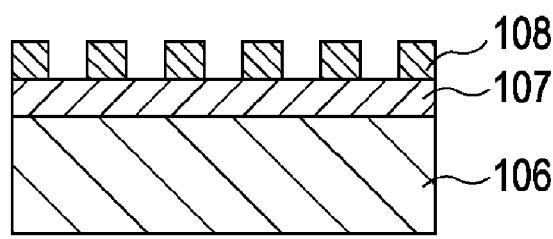
Figure 4F:
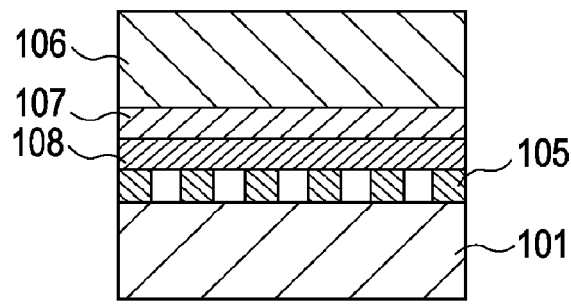
Figure 4G:
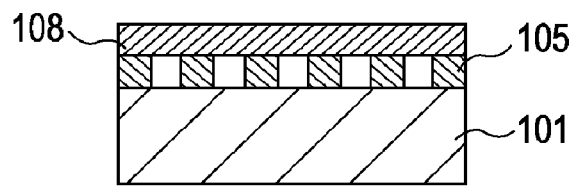

As shown in FIG. 4E, a two-dimensional periodic pattern 108 of the first medium is formed to an etching-stopping layer 107 on a substrate 106. Then, the two-dimensional periodic pattern 105 and the two-dimensional periodic pattern 108 are positioned and are fused to each other (FIG. 4F). The etching-stopping layer 107 and the substrate 106 can be removed by lift-off or etching to fabricate a laminated structure (FIG. 4G). Then, as shown in FIG. 4H, the above-mentioned processes are repeated to form a plurality of layers (for example, four layers) to constitute a fundamental period (one unit).

Figure 4H:
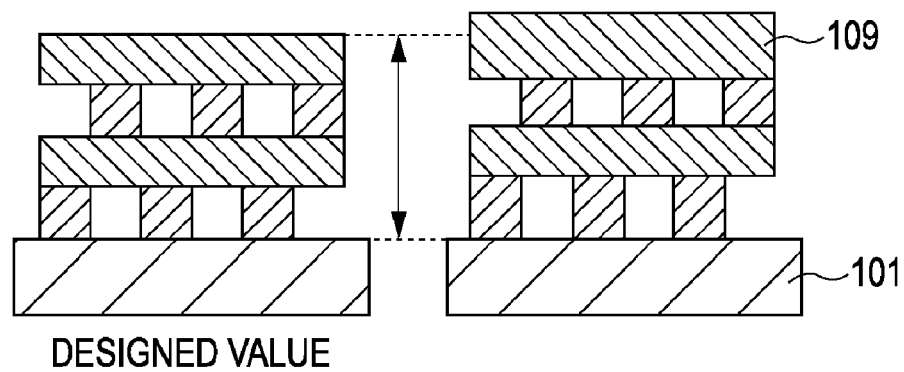

As shown in a diagram in the right of FIG. 4H, the two-dimensional periodic pattern positioned as the top layer 109 of the one unit is formed to have a height larger than a designed value so that the total layer-thickness in the one unit is certainly larger than a designed value regardless of the amount of pattern errors in the layers other than the top layer.

Figure 4I:
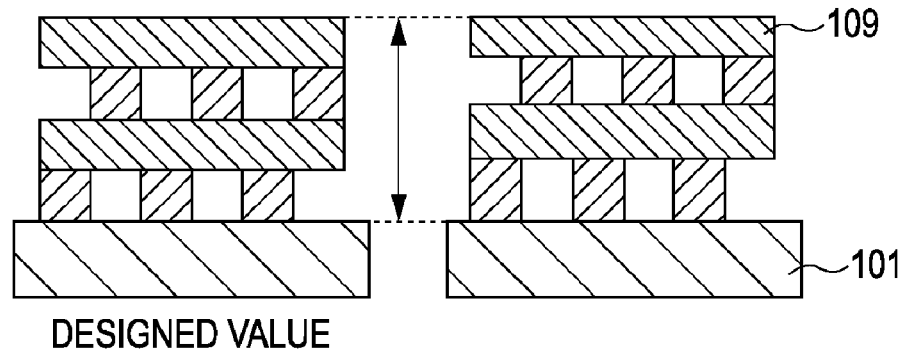

Then, as shown in FIG. 4I, after the formation of one unit, the thickness of the top layer 109 is decreased to what is calculated so that the total thickness of the one unit is the same as the desired thickness. Thus, the average layer-thickness of the plurality of layers in one unit is controlled to be equal to a designed value. The thickness of the top layer 109 can be decreased by etching, polishing by chemical mechanical polishing (CMP), etching by gas cluster ion beam (GCIB) irradiation, or ablation. In at least one exemplary embodiment, the total thickness of a plurality of layers is measured. Therefore, high accuracy measurement can be readily performed, and more precise control of the structure can be achieved.

According to the above-mentioned processes, a plurality of layers can be defined as a fundamental period. One or more fundamental periods can be defined as one unit, and the average layer-thickness of the plurality of layers in each unit can be controlled to be equal to a designed value by controlling the thickness of only one layer in the unit. This can largely increase an acceptable error range of each layer-thickness, while the optical characteristics of the whole photonic crystal are retained. As a result, the photonic crystal can be readily fabricated.

In this exemplary embodiment, the total layer-thickness is controlled after the formation of the top layer, but the total layer-thickness can be controlled to be equal to a designed value by measuring the total thickness of layers when the preceding layer of the top layer is formed to detect a difference between the total thickness and the designed value before the formation of the top layer and forming the top layer by taking the difference into consideration so that the total layer-thickness in one unit is equal to the designed value.

Figure 5:
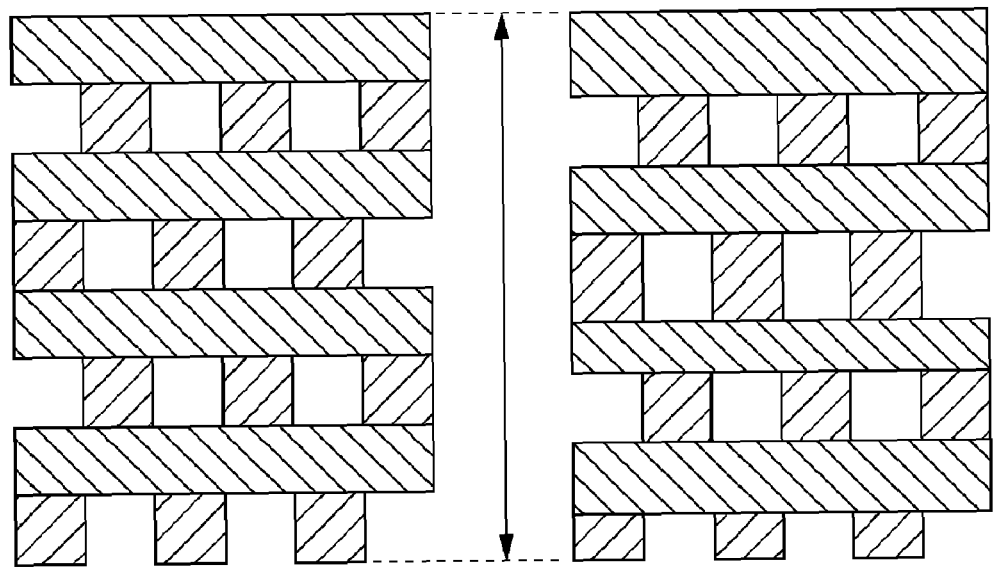
FIG. 5 is an explanatory diagram of a photonic crystal according to at least one exemplary embodiment.

One unit can be constituted by four layers (one fundamental period) as described in exemplary embodiment 1 or can be constituted by eight layers (two periods) as shown in FIG. 5. The number of the layers comprising one unit can be determined in view of controllability of fabrication and symmetry of optical characteristics.

Figure 6:
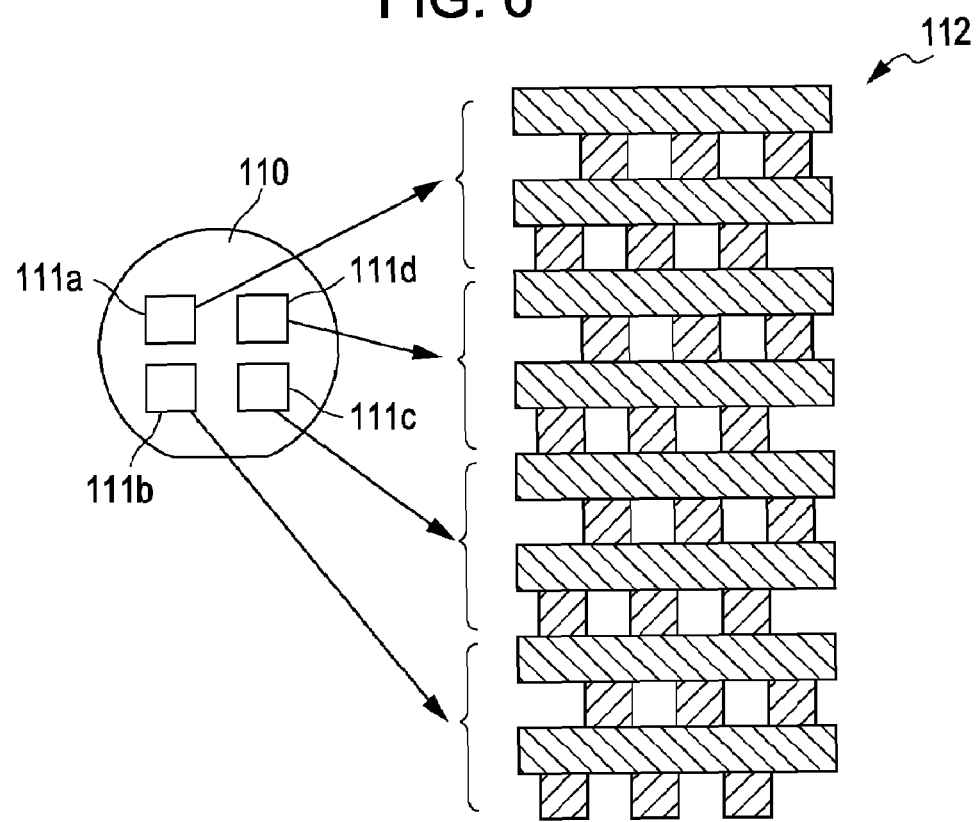
FIG. 6 is an explanatory diagram of a method for fabricating a photonic crystal according to at least one exemplary embodiment.

As shown in FIG. 6, a photonic crystal 112 can be formed by forming a plurality of unit structures 111 (111a to 111d) on a wafer 110 in such a manner that the average layer-thickness of the plurality of layers in each unit is equal to a designed value and by stacking the unit structures. With this, the number of lamination can be readily increased while the optical characteristics which are the same as designed values are retained. Consequently, a higher refractive index can be obtained in the photonic band-gap wavelength region.

The two-dimensional periodic pattern can be formed by using an interference exposure method, a nanoimprint method, a method utilizing a multiphoton absorption process with ultra-short pulse light, or a combination of lithography technologies such as X-ray exposure, UV exposure, and near-field exposure and etching. The two-dimensional periodic pattern can be formed by selective growth using a mask pattern.

The stacking of the two-dimensional periodic patterns can be conducted by a method using a conventional wafer fusion technique or a method repeating deposition and polishing.

Examples of the first medium (the first region) comprising the three-dimensional photonic crystals according to at least one exemplary embodiment include semiconductors of a compound such as GaAs, InP, GaN, and ZnO, semiconductors such as Si, dielectric materials such as $TiO_2$, and metals. Examples of the second medium (the second region), which can have a refractive index lower than that of the first medium include dielectric materials such as $SiO_2$, high-molecular organic materials such as PMMA, and air.

Exemplary Embodiment 4

Figure 7A:
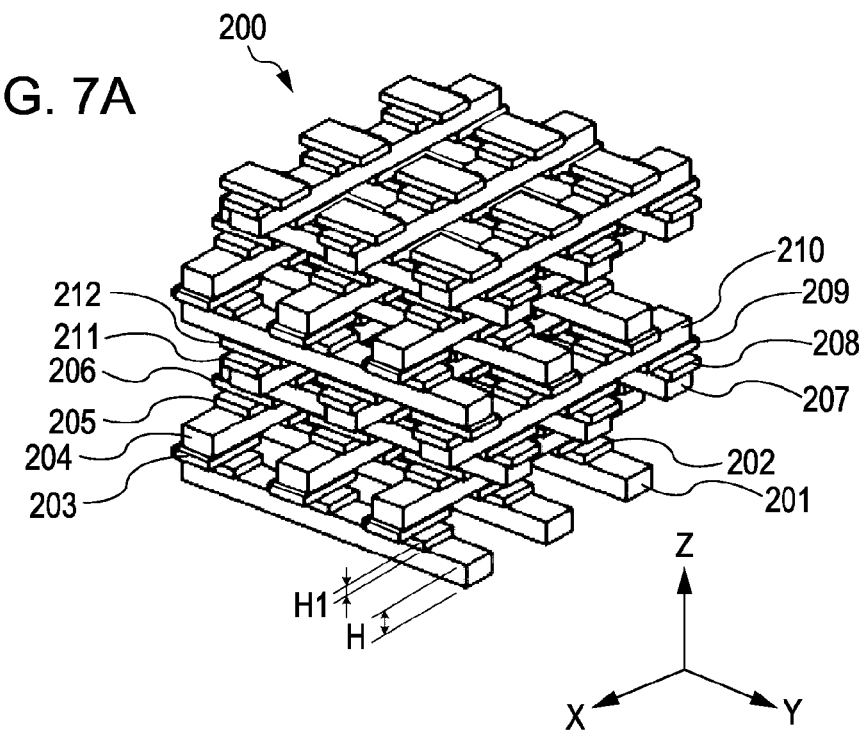
FIG. 7A is an explanatory diagram of a photonic crystal according to at least one exemplary embodiment.
Figure 11:
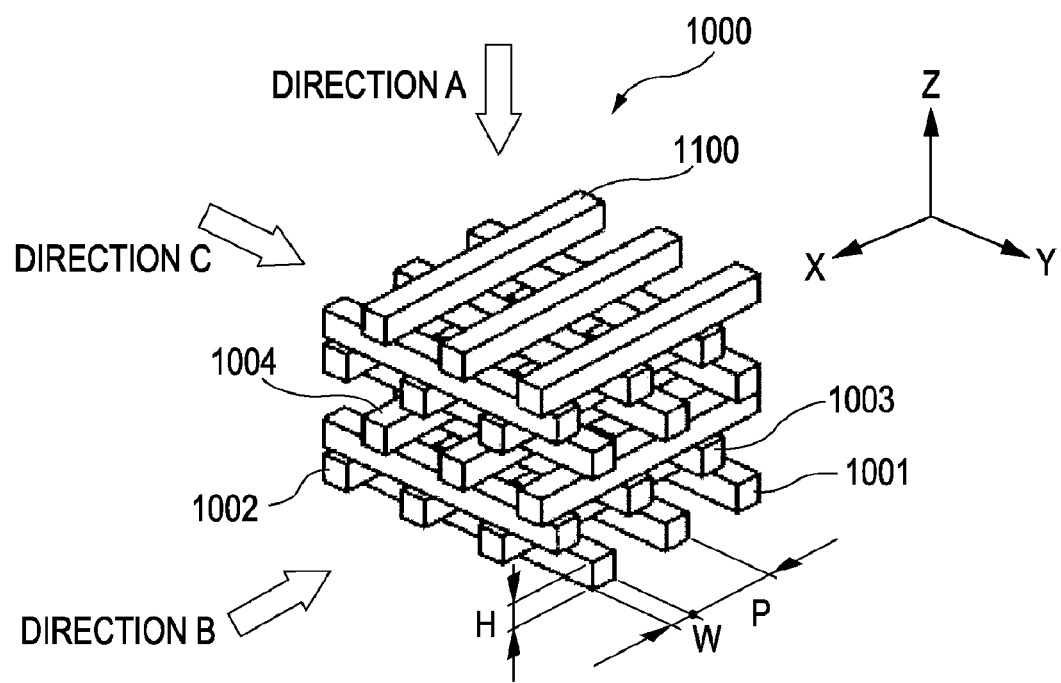
FIG. 11 is an explanatory diagram of a photonic crystal having a woodpile structure.
Figure 12A:
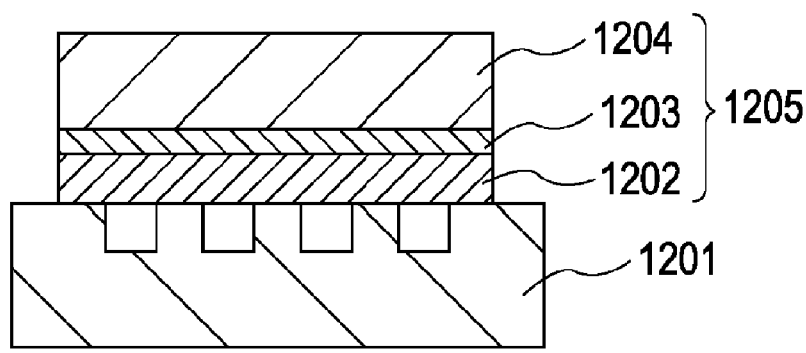
FIGS. 12A to 12C are explanatory diagrams showing a conventional method for fabricating a photonic crystal.
Figure 12B:
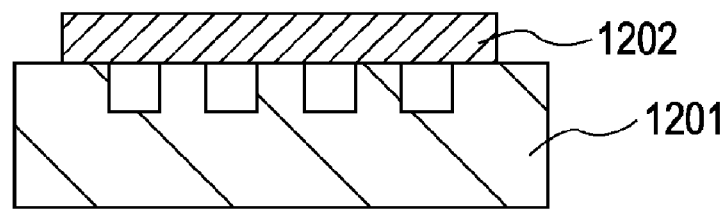
Figure 12C:
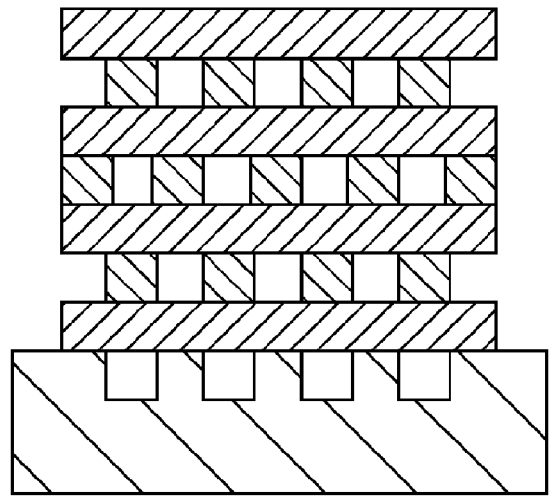
Figure 13A:
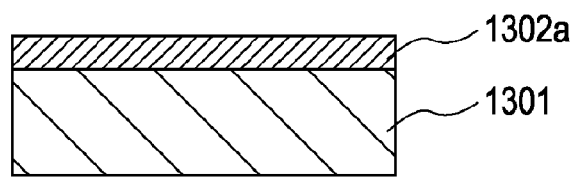
FIGS. 13A to 13E are explanatory diagrams showing a conventional method for fabricating a photonic crystal.
Figure 13B:
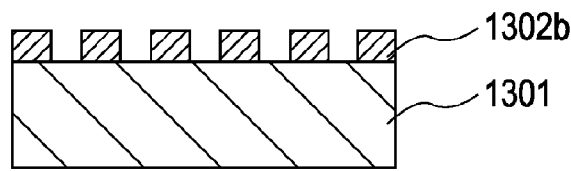
Figure 13C:
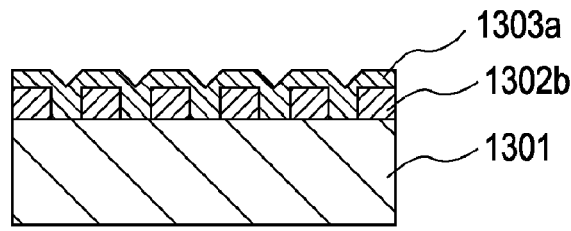
Figure 13D:
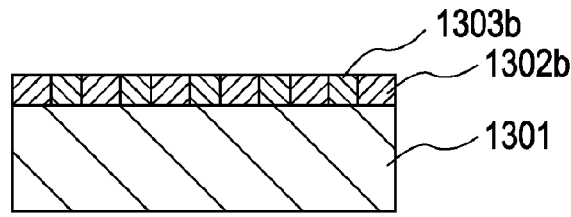
Figure 13E:
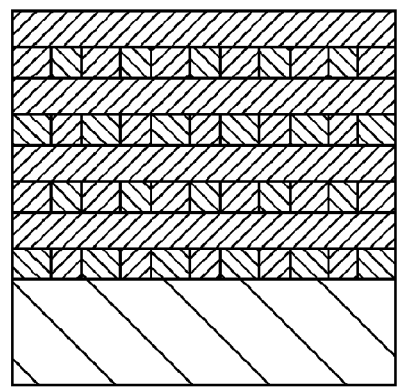

With reference to FIG. 7A, an implementation at least one exemplary embodiment in an LBL structure which is different from the woodpile structure shown in FIG. 11 will be described.

Figure 7B:
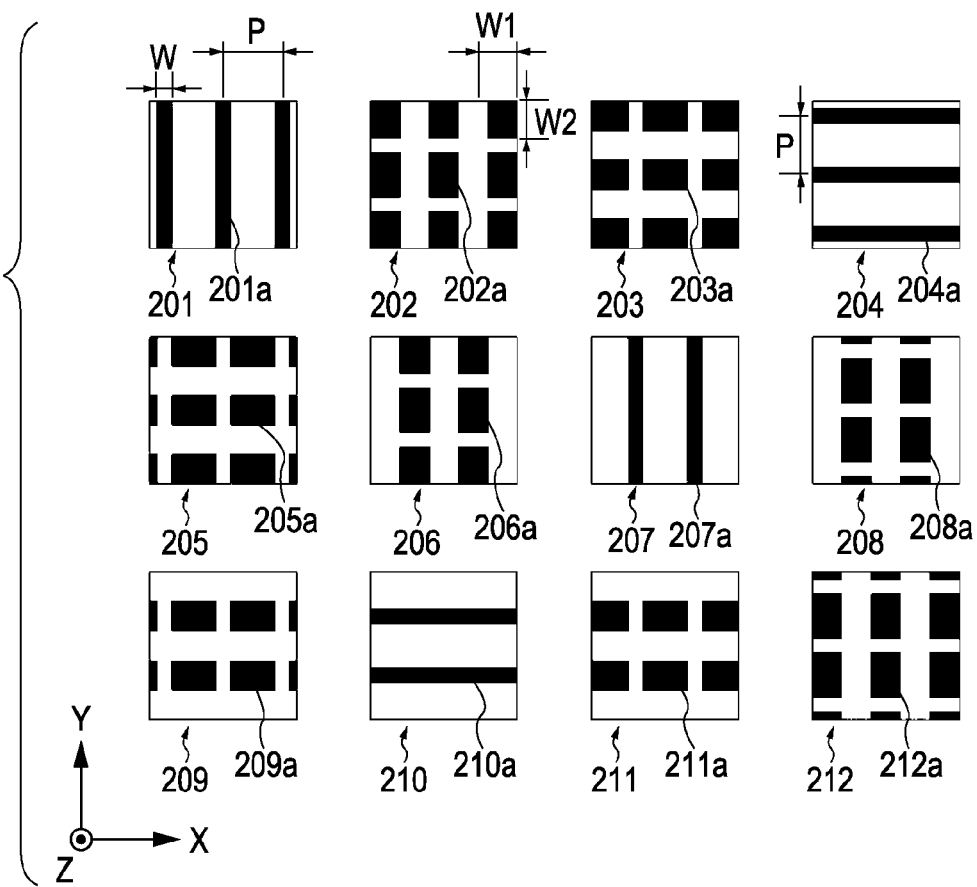
FIG. 7B is explanatory diagrams of a photonic crystal according to at least one exemplary embodiment.

An LBL structure 200 shown in FIG. 7A is a photonic crystal structure exhibiting a photonic band-gap broader than that of the woodpile structure. The LBL structure 200 includes twelve layers 201 to 212 which can have an XY plane as a fundamental period. FIG. 7B shows parts of XY cross-sections of each of the layers. In a first layer 201 and a seventh layer 207, a plurality of rectangular rods 201a and 207a, which are made of a first medium and extend in the Y-axis direction, are arrayed at a pitch P in the X-axis direction. The rectangular rods 207a are arrayed so as to be shifted from the positions of the rectangular rods 201a by a distance of P/2 in the X-axis direction. In a fourth layer 204 and a tenth layer 210, a plurality of rectangular rods 204a and 210a, which are made of the first medium and extend in the X-axis direction, are arrayed at a pitch P in the Y-axis direction. The rectangular rods 210a are arrayed so as to be shifted from the positions of the rectangular rods 204a by a distance of P/2 in the Y-axis direction. In a second layer 202 and a third layer 203, cuboids 202a and 203a made of the first medium are arrayed in such a manner that the cuboids are not in contact with each other in the XY plane. The cuboids 202a and 203a are arrayed in positions corresponding to intersections of the rectangular rods 201a of the first layer 201 and the rectangular rods 204a of the fourth layer 204 when viewed from the Z-axis direction. The cuboids 202a and the cuboids 203a are lapped over each other by rotating 90° in the XY plane, thus they are symmetric to each other. Similarly, in a fifth layer 205, a sixth layer 206, a eighth layer 208, and a ninth layer 209 disposed between the layers 204, 207, and 210, which can have the rectangular rods, and in an eleventh layer 211 and a twelfth layer 212, cuboids 205a, 206a, 208a, 209a, 211a, and 212a made of the first medium, are discretely arrayed in the XY plane. The rectangular rods and the cuboids in each of the layers can be in contact with each other or operatively connected, and portions other than the rectangular rods and the cuboids in each of the layers are filled with a second medium. Refractive indices of the first and second media, shapes of the rectangular rods and the cuboids, distances between the rectangular rods and between the cuboids, and thicknesses of each layer are determined so that a photonic band-gap occurs in a desired wavelength region.

Figure 8A:
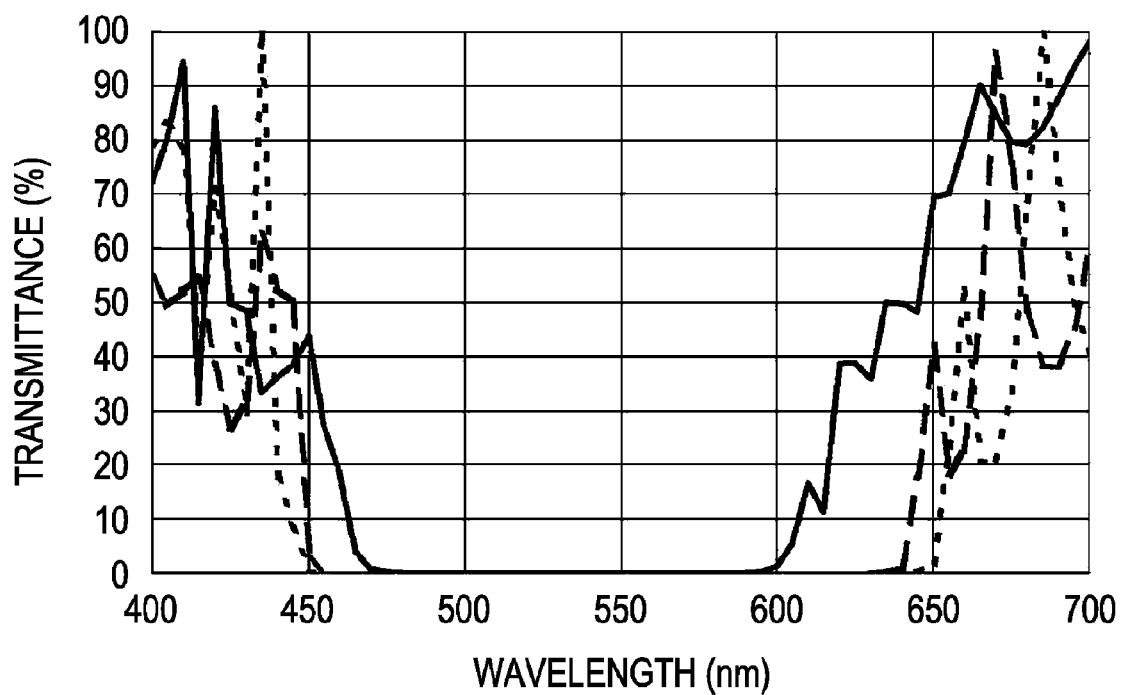
FIG. 8A is an explanatory graph showing a relationship between a fabrication error in a photonic crystal and a photonic band.

The LBL structure 200 according to exemplary embodiment 4 includes six periods. The refractive index of the rectangular rods and the cuboids was adjusted to 3.309, and the refractive index of portions other than the rectangular rods and the cuboids was adjusted to 1. The rectangular rods had a width W of 63 nm and a height H of 52 nm, and are arrayed at a pitch P of 208 nm. The cuboids had a length W1 of 125 nm, a width W2 of 83 nm, and a height H1 of 10 nm. FIG. 8A shows transmission spectra of the LBL structure calculated (e.g., by using RCWA). The dotted line, solid line, and broken line show transmission spectra of incident light from the respective directions as in FIG. 2A. In the designed values in this exemplary embodiment, a complete photonic band occurs in the wavelength range of 470 to 600 nm.

Figure 8B:
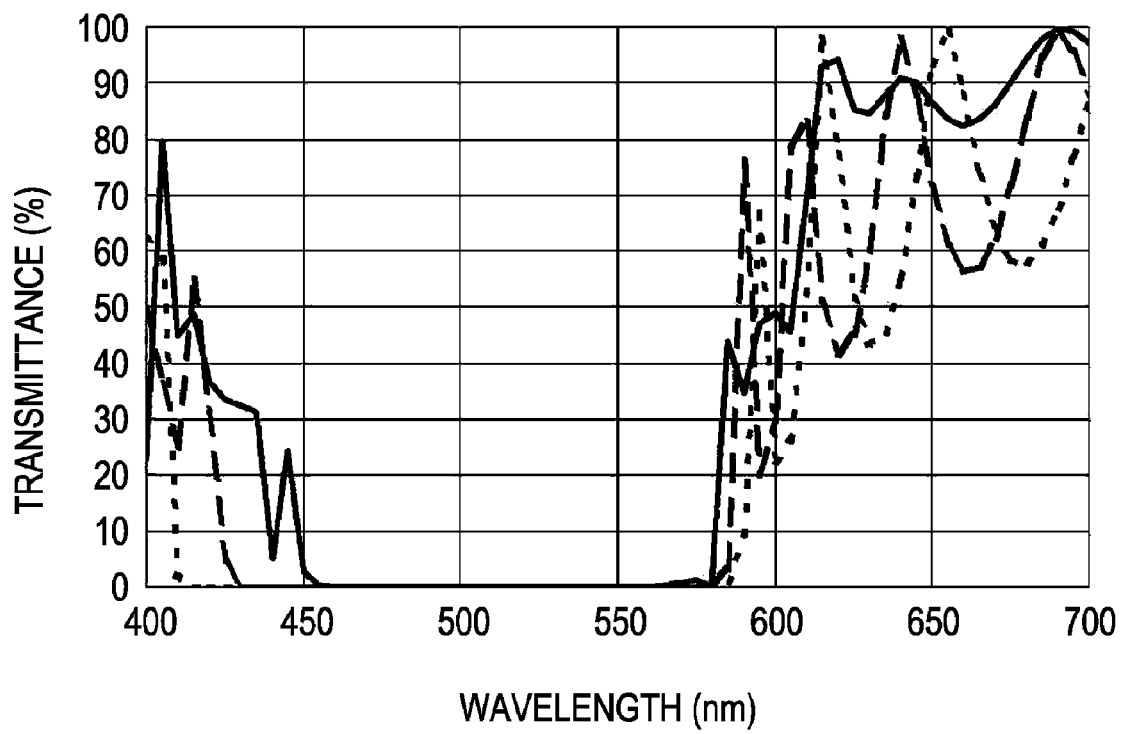
FIG. 8B is an explanatory graph showing a relationship between a fabrication error in a photonic crystal and a photonic band.

FIG. 8B shows transmission spectra when all the rectangular rods had a height H which was 5.2 nm lower than a designed value and all the cuboids had a height H1 which was 1 nm lower than a designed value due to fabrication errors. The complete photonic band-gap had a wavelength range of 450 to 580 nm. Thus, the photonic band-gap wavelength (central wavelength) shifted about 20 nm toward the shorter wavelength side when the rectangular rods and the cuboids had a height which was 10% lower than a designed value.

Figure 8C:
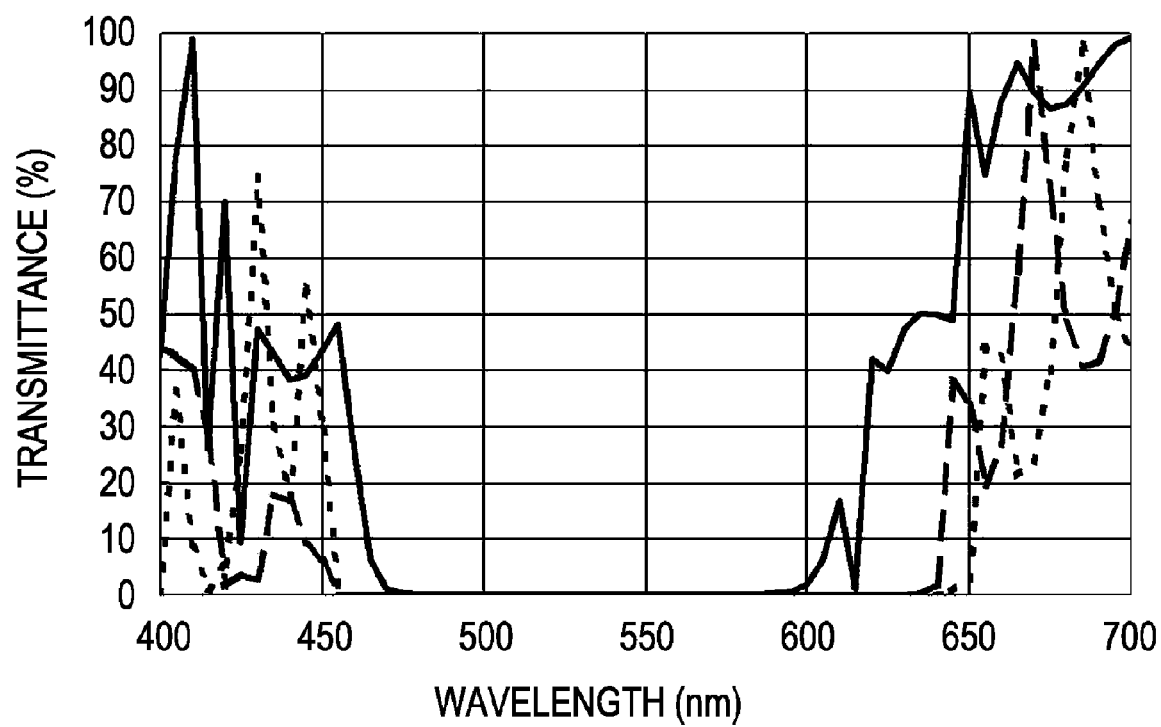
FIG. 8C is an explanatory graph showing a relationship between a fabrication error in a photonic crystal and a photonic band.

In this exemplary embodiment, twelve layers were defined as a fundamental period. One or more fundamental periods can be defined as one unit, but one fundamental period was defined as one unit in this exemplary embodiment and the total layer-thickness of the one unit was adjusted to 288 nm, which was the same as the designed thickness. FIG. 8C shows transmission spectra when the rectangular rods in the twelve layers had a height of 54.6 nm (2.6 nm higher than the designed value: +2.6 nm), 46.8 nm (−5.2 nm), 49.4 nm (−2.6 nm), and 57.2 nm (+5.2 nm), respectively. A complete photonic band occurred in the wavelength region of 470 to 600 nm which was the same as the designed value. The spectrum in each incident direction was approximately the same as the designed value.

As above, it is confirmed that the effects of the present invention are not limited in the woodpile structure and also are not limited by the structure of the photonic crystal so far discussed.

Exemplary Embodiment 5

An example of a functional element using a photonic crystal fabricated by the method according to at least one exemplary embodiment will be described.

Figure 9A:
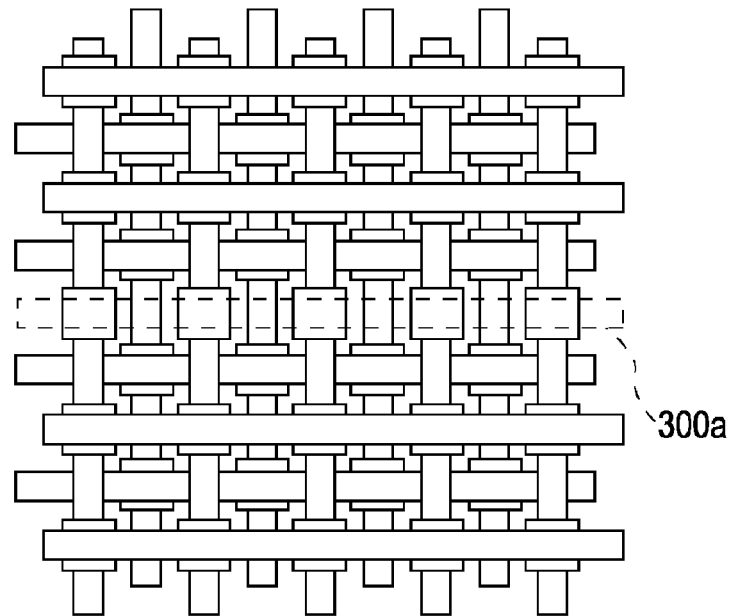
FIG. 9A is an explanatory diagram of a functional element using the photonic crystal according to at least one exemplary embodiment.
Figure 9B:
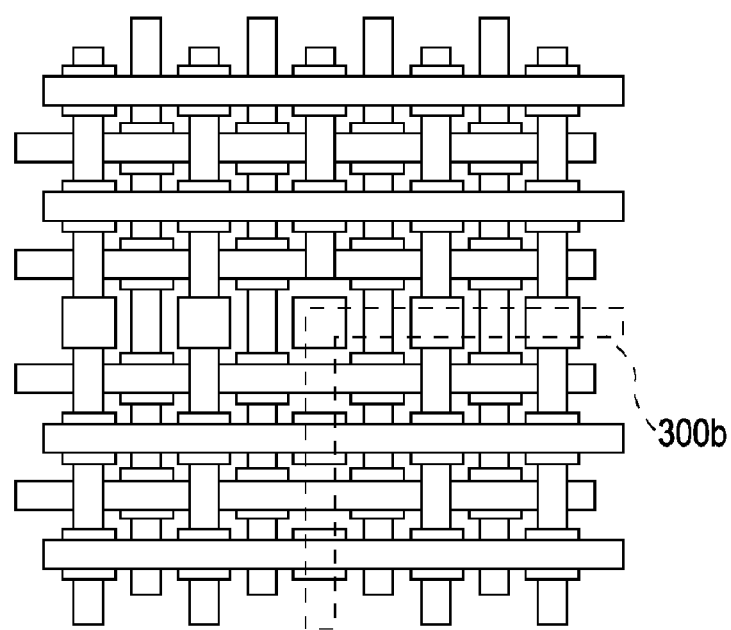
FIG. 9B is an explanatory diagram of a functional element using the photonic crystal according to at least one exemplary embodiment.

FIGS. 9A and 9B show photonic crystals fabricated by the method according to at least one exemplary embodiment and are cross-sectional views of functional elements each of which can have a waveguide 300 (300a or 300b) arranging a linear defect. The waveguide, which can achieve bending at a sharp angle with low-loss, includes forming the linear defect in the photonic crystals.

FIG. 9A is a cross-sectional view of a straight-line waveguide 300a which includes removing only a predetermined region of a structure in the photonic crystal fabricated by the method according to at least one exemplary embodiment. FIG. 9B is a cross-sectional view of a bending waveguide 300b which includes removing only a predetermined region of a structure in the photonic crystal fabricated by a method according to at least one exemplary embodiment. The linear defect is formed by removing or shifting the structure or changing the shape of the structure so that desired performance such as a wavelength region of a guided wave is provided. Since the photonic crystal fabricated by the method according to at least one exemplary embodiment has a photonic band wavelength with a high accuracy, a waveguide which performs in a desired wavelength region can be readily fabricated.

Figure 10:
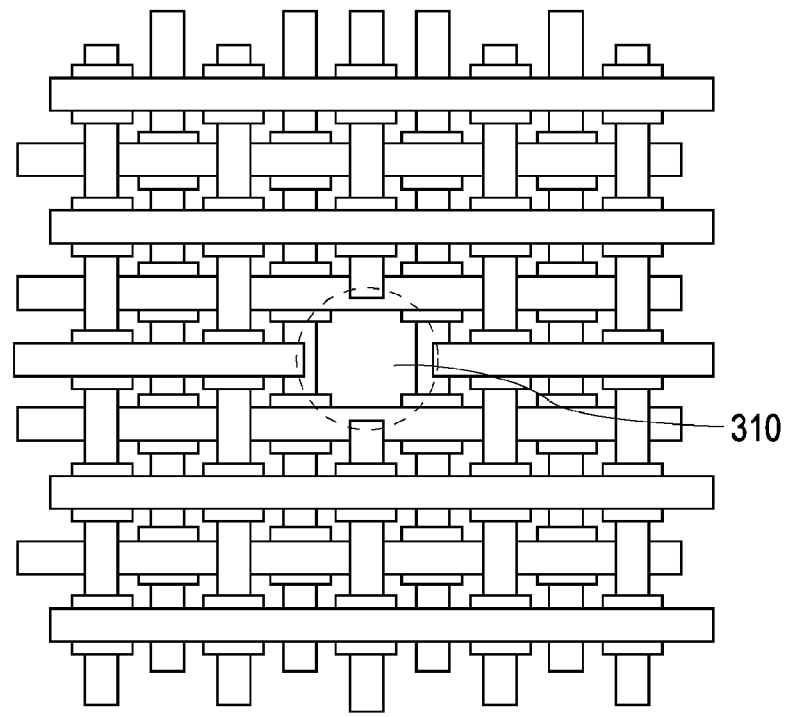
FIG. 10 is an explanatory diagram of a functional element using the photonic crystal according to at least one exemplary embodiment.

FIG. 10 is a cross-sectional view of a resonator provided with a point defect 310 in a photonic crystal fabricated by the method according to at least one exemplary embodiment.

In the embodiment shown in FIG. 10, electromagnetic waves are confined in a very small region and a high-performance resonator with a large confinement effect includes providing the point defect 310. By using this resonator, a wavelength-selecting filter for drawing, from incident waves, electromagnetic waves, which can have a narrow wavelength region which corresponds to a resonant wavelength of the resonator, can be achieved. The point defect 310 is formed by removing or shifting the structure part or changing a shape of the structure part so that the resonator has desired performance such as wavelength selection. Thus, a resonator that performs in a desired wavelength region can be readily produced by comprising the resonator by using a photonic crystal fabricated by the method according to at least one exemplary embodiment.

In this exemplary embodiment, very high-efficiency light-emitting elements such as lasers and LEDs can be achieved by filling the resonator shown in FIG. 10 with an active medium and supplying energy to the resonator by an electromagnetic wave or an electric current from the outside of the resonator. The resonator can be used as a light source for optical communication by adjusting the resonant wavelength of the resonator to an infrared optical communication wavelength band (800 to 1800 nm). The resonator can be used as a light source for a display apparatus by adjusting the resonant wavelength of the resonator to light's three primary colors: red (R), green (G), and blue (B). The resonator can be also used as a light source for a pickup device for optical disks such as CDs and DVDs. Additionally, a subminiature high-performance integrated circuit can be achieved by combining various functional elements such as the waveguides shown in FIGS. 9A and 9B, the resonator shown in FIG. 10, light-emitting elements, and polarization elements using dispersion abnormality in a photonic band.

As described above, in each exemplary embodiment, a plurality of layers periodically stacked can be defined as a fundamental period, and one or more of the fundamental periods can be defined as one unit. By fabricating a photonic crystal in such a manner that the average layer-thickness of the plurality of layers in each unit is equal to a designed value, the acceptable error range in each layer-thickness can be largely increased while the optical characteristics of the whole photonic crystal are retained. Thus, the photonic crystal can be readily fabricated.

Additionally, functional elements which perform in a desired wavelength region can be readily produced by comprising the functional elements by using the photonic crystals fabricated by the method according to at least one exemplary embodiment.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. A method for fabricating a three-dimensional photonic crystal by stacking a plurality of layers including a refractive index periodic structure, the method comprising:
   forming a laminated product by stacking layers of which number is smaller, by one, than the number of layers constituting a laminated structure of one unit
   measuring a total layer-thickness of the laminated product; and
   stacking a top layer of the laminated structure of the one unit on the laminated product based on a result of comparison between the total layer-thickness of the laminated product and a total layer-thickness of layers of which number is smaller, by one, than the number of layers of which total layer-thickness is calculated such that a photonic band-gap occurs in a desired wavelength region.

2. The method for fabricating a three-dimensional photonic crystal according to claim 1, wherein the number of the layers constituting the one unit is equal to an integral multiple of the number of the layers constituting a fundamental period of the three-dimensional photonic crystal.

3. The method for fabricating a three-dimensional photonic crystal according to claim 1, wherein a plurality of the laminated structures of the one unit are collectively formed on a substrate.

4. A functional element comprising a three-dimensional photonic crystal fabricated by the method according to claim 1, wherein the three-dimensional photonic crystal comprises a linear periodic defect part that functions as a waveguide.

5. A functional element comprising a three-dimensional photonic crystal fabricated by the method according to claim 1, wherein the three-dimensional photonic crystal comprises a periodic defect part that functions as a resonator.

6. A light-emitting element which comprises the functional element according to claim 5 comprising an active medium having a light-emitting function in the resonator and comprises an excitation means for exciting the active medium.

7. The light-emitting element according to claim 6, wherein the light-emitting element is a laser.

* * * * *